US012620559B2

(12) United States Patent
Kim et al.

(10) Patent No.: US 12,620,559 B2
(45) Date of Patent: May 5, 2026

(54) GAS SUPPLY DEVICE AND PLASMA PROCESSING APPARATUS

(71) Applicant: Samsung Electronics Co., Ltd., Suwon-si (KR)

(72) Inventors: Sohee Kim, Suwon-si (KR); Kyeongtea Bang, Suwon-si (KR); Hakyoung Kim, Suwon-si (KR); Seungbin Lim, Suwon-si (KR); Yongwoo Kim, Suwon-si (KR); Junghyun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 94 days.

(21) Appl. No.: 18/809,754

(22) Filed: Aug. 20, 2024

(65) Prior Publication Data

US 2025/0259826 A1     Aug. 14, 2025

(30) Foreign Application Priority Data

Feb. 14, 2024     (KR) ........................ 10-2024-0020790

(51) Int. Cl.
*H01J 37/32*     (2006.01)

(52) U.S. Cl.
CPC .............................. *H01J 37/32449* (2013.01)

(58) Field of Classification Search
None
See application file for complete search history.

(56) References Cited

U.S. PATENT DOCUMENTS

| | | | |
|---|---|---|---|
| 9,405,298 B2 * | 8/2016 | Geoffrion | G05D 11/132 |
| 10,607,819 B2 * | 3/2020 | Takahashi | H01J 37/32853 |
| 2005/0241763 A1 * | 11/2005 | Huang | C23C 16/45565 |
| | | | 156/345.33 |
| 2008/0078505 A1 | 4/2008 | Kofuji et al. | |
| 2014/0041804 A1 | 2/2014 | Nagatani et al. | |
| 2014/0148015 A1 | 5/2014 | Larson | |
| 2016/0203996 A1 | 7/2016 | Jeon et al. | |
| 2018/0277402 A1 | 9/2018 | Kawakami et al. | |
| 2019/0164725 A1 | 5/2019 | Kawakami et al. | |
| 2019/0346300 A1 * | 11/2019 | Kim | C23C 16/345 |
| 2022/0115213 A1 | 4/2022 | Sawachi | |

FOREIGN PATENT DOCUMENTS

| | | |
|---|---|---|
| KR | 10-2010-0042150 A | 4/2010 |
| KR | 10-2019-0062146 B1 | 12/2020 |

* cited by examiner

*Primary Examiner* — Jany Richardson
(74) *Attorney, Agent, or Firm* — Muir Patent Law, PLLC

(57)     ABSTRACT

A gas supply device includes a plurality of flow ratio controllers configured to output a plurality of processing gases supplied from a gas box according to respective predetermined flow ratios; a plurality of switching valve sets connecting the plurality of flow ratio controllers to a plurality of supply pipes connected to a plurality of regions in a chamber or to a bypass pipe; a conductance control valve configured to control conductance of the bypass pipe; and a controller configured to control a processing gas output by one of the plurality of flow ratio controllers to be discharged through the bypass pipe, while a processing gas output by another of the plurality of flow ratio controllers is supplied to the plurality of regions in the chamber, wherein the controller is configured to control the conductance control valve when a processing gas supplied to the plurality of regions is switched.

20 Claims, 12 Drawing Sheets

291

MACHINE
LEARNING
MODEL
GENERATOR

292

MACHINE
LEARNING
MODEL

He Plasma Intensity (a.u.)

- - - - COMPARATIVE EXAMPLE
——— EXAMPLE EMBODIMENT

Stable | Process1 | Stable | Process2

Nth Step | (N+1)th Step

Process Step

COMPARATIVE EXAMPLE

EXAMPLE EMBODIMENT

GAS SUPPLY DEVICE AND PLASMA PROCESSING APPARATUS

CROSS-REFERENCE TO RELATED APPLICATION(S)

This application claims benefit of priority to Korean Patent Application No. 10-2024-0020790 filed on Feb. 14, 2024 in the Korean Intellectual Property Office, the disclosure of which is incorporated herein by reference in its entirety.

BACKGROUND

Example embodiments of the present disclosure relate to a gas supply device and a plasma processing apparatus including the same.

Semiconductor devices may be manufactured using various semiconductor manufacturing processes, including deposition processes, ion implantation processes, photolithography processes, and etching processes. As semiconductor devices have been highly integrated, a line width of patterns included in semiconductor devices has decreased and aspect ratios of contacts and vias have increased. Due to the decrease in line width and/or increase in aspect ratios of contacts and vias, difficulty of a process of manufacturing a semiconductor device has increased.

Plasma processing apparatus has been used in a process of manufacturing semiconductor devices. As semiconductor devices have been highly integrated, aspect ratios of patterns have increased. To form a pattern having a high aspect ratio, a plasma processing apparatus which may provide process gas having uniform plasma density in each process may be necessary.

SUMMARY

An example embodiment of the present disclosure provides a gas supply device which may swiftly switch processing gases for forming plasma in each process and may suppress pressure fluctuations in a chamber of a plasma processing apparatus when processing gas is switched.

An example embodiment of the present disclosure provides a plasma processing apparatus which may reduce the time required for an entire process and may have improved productivity.

According to an example embodiment, a gas supply device includes a first flow ratio controller configured to output a first processing gas supplied from a gas box to a plurality of first output pipes according to a first flow ratio; a second flow ratio controller configured to output a second processing gas supplied from the gas box to a plurality of second output pipes according to a second flow ratio; a plurality of first supply valves connecting a plurality of first output pipes to a plurality of supply pipes connected to the plurality of regions in a chamber; a plurality of second supply valves connecting the plurality of second output pipes to the plurality of supply pipes; a plurality of first bypass valves connecting the plurality of first output pipes to a bypass pipe; a plurality of second bypass valves connecting the plurality of second output pipes to the bypass pipe; a conductance control valve configured to control conductance of the bypass pipe; and a controller configured to supply the first processing gas into the chamber at a first time point at which a processing gas supplied into the chamber is switched from the second processing gas to the first processing gas, by opening the plurality of first supply valves and the plurality of second bypass valves and to close the plurality of second supply valves and the plurality of first bypass valves, configured to supply the second processing gas into the chamber at a second time point at which a gas supplied into the chamber is switched from the first processing gas to the second processing gas, by opening the plurality of second supply valves and the plurality of first bypass valves and to close the plurality of first supply valves and the plurality of second bypass valves, and configured to control the conductance control valve to suppress changes in internal pressure of the chamber at the first time point and the second time point.

According to an example embodiment, a gas supply device includes a first flow ratio controller configured to output a first processing gas supplied from a gas box to a plurality of first output pipes according to a first flow ratio; a second flow ratio controller configured to output a second processing gas supplied from the gas box to a plurality of second output pipes according to a second flow ratio; a first switching valve set connecting the plurality of first output pipes to a plurality of supply pipes connected to a plurality of regions in a chamber or to a bypass pipe; a second switching valve set connecting the plurality of second output pipes to the plurality of supply pipes or the bypass pipe; a conductance control valve configured to control conductance of the bypass pipe; and a controller configured to control the conductance control valve such that conductance of the bypass pipe is the same as conductance of the plurality of supply pipes at a first time point at which a processing gas provided by the plurality of supply pipes is switched from the first processing gas to the second processing gas, or a second time point at which the processing gas is switched from the second processing gas to the first processing gas.

According to an example embodiment, a gas supply device includes a plurality of flow ratio controllers configured to output a plurality of processing gases supplied from a gas box according to respective predetermined flow ratios; a plurality of switching valve sets connecting the plurality of flow ratio controllers to a plurality of supply pipes connected to a plurality of regions in a chamber or to a bypass pipe; a conductance control valve configured to control conductance of the bypass pipe; and a controller configured to control a processing gas output by one of the plurality of flow ratio controllers to be discharged through the bypass pipe, while a processing gas output by another of the plurality of flow ratio controllers is supplied to the plurality of regions in the chamber, wherein the controller is configured to perform feedforward control and feedback control over the conductance control valve based on a process recipe and pressure of the chamber at a time point at which a processing gas supplied to the plurality of regions is switched.

According to an example embodiment, a plasma processing apparatus includes a chamber body providing a chamber; a gas supply device including a first flow ratio controller configured to output a first processing gas by distributing the first processing gas at a first flow ratio and a second flow ratio controller configured to output a second processing gas by distributing the second processing gas at a second flow ratio; a gas distribution device configured to output the first processing gas or the second processing gas to a plurality of regions in the chamber and including an upper electrode to which a first power source is electrically connected; a substrate supporter configured to support a substrate and including a lower electrode to which a second power source is electrically connected; an exhaust device configured to discharge a processing gas from the chamber; and a controller configured to control the gas supply device, the first power source, the substrate supporter, the second power source and the exhaust device such that a first process using the first processing gas and a second process using the second processing gas are performed alternately, wherein the gas supply device further includes a plurality of supply pipes connected to the gas distribution device and a bypass pipe connected to an external device outside the chamber, and wherein the controller is further configured to switch connections between the first flow ratio controller, the second flow ratio controller, the gas distribution device and the bypass pipe, and to control conductance of the bypass pipe such that conductance of the gas distribution device becomes the same as the conductance of the bypass pipe.

BRIEF DESCRIPTION OF DRAWINGS

The above and other aspects, features, and advantages in the example embodiment will be more clearly understood from the following detailed description, taken in combination with the accompanying drawings, in which.

DETAILED DESCRIPTION

Hereinafter, embodiments in the example embodiment will be described as follows with reference to the accompanying drawings.

Figure 1:
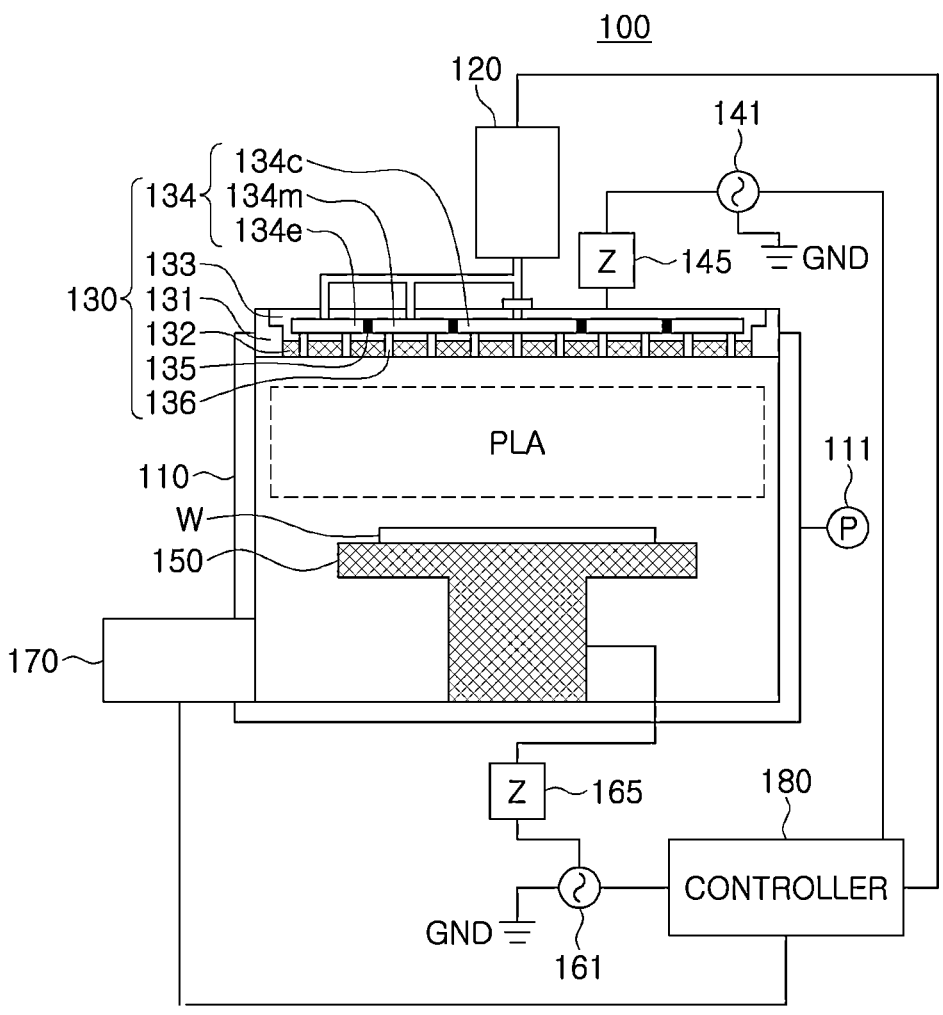
FIG. 1 is a diagram illustrating a plasma processing apparatus according to an example embodiment of the present disclosure.

FIG. 1 is a diagram illustrating a plasma processing apparatus according to an example embodiment.

Referring to FIG. 1, a plasma processing apparatus 100 may include a chamber body 110, a gas supply device 120, a gas distribution device 130, a first power source 141, a first matching network 145, a substrate supporter 150, a second power source 161, a second matching network 165, an exhaust device 170 and a controller 180.

The chamber body 110 may provide a chamber space in which a process of manufacturing a semiconductor device may be performed. For example, the process of manufacturing a semiconductor device may be a plasma process. In an example embodiment, the process of manufacturing a semiconductor device may be a reactive ion etch (RIE) process, and the plasma processing apparatus 100 may be implemented as a RIE reactor configured to perform an etching process of a high aspect ratio using plasma PLA, but the inventive concept is not limited thereto. For example, the plasma processing apparatus 100 may perform processes such as plasma annealing, plasma strengthening, chemical vapor deposition, physical vapor deposition, and plasma cleaning processes.

In the description below, example embodiments in which the plasma processing apparatus 100 is configured as a device using capacitively coupled plasma (CCP) will be described, but the inventive concept is not limited thereto. For example, the example embodiments may be applied to the plasma processing apparatus 100 using one of electron cyclotron resonance (ECR) plasma, inductively coupled plasma (ICP), helical plasma, and high density plasma.

The chamber body 110 may be configured to generate the plasma PLA in a plasma processing space proximity to a surface of the substrate W. The plasma PLA may be used to deposit specific materials on the substrate W and/or to remove/etch materials from the exposed surfaces of the wafer W.

The substrate W may be a semiconductor substrate having various diameters, such as 150 mm, 200 mm and 300 mm. For example, the substrate W may include semiconductor materials such as silicon, germanium, silicon-germanium, or the like, and may further include an epitaxial layer, a silicon on insulator (SOI) layer, a germanium on insulator (GOI) layer, a semiconductor on insulator (SeOI) layer, or the like.

The gas distribution device 130 disposed in an upper portion of the process chamber 110 may perform an upper electrode function (e.g., may be used as an electrode), and the substrate supporter 140 disposed in the process chamber 110 may perform a lower electrode function (e.g., may be used as an electrode). The processing gas output by the gas supply device 120 may flow into the chamber through the gas distribution device 130. The gas distribution device 130 may uniformly provide a processing gas into the chamber. For example, the gas distribution device may provide uniform distribution of the processing gas in the chamber. A flow rate of processing gas may be controlled by the gas supply device 120. The process chamber 110 may include a chamber pressure sensor 111 to measure internal pressure of the chamber. Spatially relative terms, such as "beneath," "below," "lower," "above," "upper," "top," "bottom," "front," "rear," and the like, may be used herein for ease of description to describe positional relationships, such as illustrated in the figures, for example. It will be understood that the spatially relative terms encompass different orientations of the device in addition to the orientation depicted in the figures.

The gas distribution device 130 may include a shielding member 131, an electrode plate 132, an electrode supporter 133, a diffusion chamber 134, a partition 135 and a gas hole 136. The shielding member 131 may support the electrode plate 132 on the chamber body 110. Also, the electrode supporter 133 may be disposed on the electrode plate 132.

In the electrode supporter 133, a diffusion chamber 134 including a disc-shaped space may be disposed. The diffusion chamber 134 may be partitioned into a plurality of spaces. For example, the diffusion chamber 134 may include a ring-shaped partition member 135, and the diffusion chamber 134 may be partitioned into a plurality of spaces in a radial direction by partition members 135. For example, the diffusion chamber 134 may include three regions/spaces, which may be a central space 134c vertically overlapping a central portion of the substrate W, a peripheral space 134m vertically overlapping a peripheral portion of the substrate W, and an outer space 134e vertically not overlapping the substrate W when the substrate W is loaded on the substrate supporter 150 for a process. However, the inventive concept is not limited thereto, and the number of spaces partitioning the diffusion chamber 134 may be 2 or more than 3.

The plurality of gas holes 136 may penetrate the electrode plate 132, e.g., in a vertical direction, and may connect the central space 134c, the peripheral space 134m, and the outer space 134e to an internal region of the chamber.

The gas supply device 120 may include a flow ratio controller FRC to uniformly provide processing gas into the chamber. The flow ratio controller may output the processing gas to the central space 134c, the peripheral space 134m and the outer space 134e according to a predetermined flow ratio. Also, the processing gas output to the central space 134c, the peripheral space 134m and the outer space 134e may be supplied into the chamber through the plurality of gas holes 136. Since the processing gas flows into the chamber through the plurality of gas holes 136 formed in various positions, density of the processing gas for each region in the chamber may be uniform.

The first power source 141 may be electrically connected to the gas distribution device 130. The first power source 141 may supply source power to generate the plasma PLA to the plasma processing apparatus 100. While a semiconductor process is performed, the plasma PLA may be generated from the processing gas by the source power. The source power may be provided by a signal in a radio frequency (RF) range. In an example embodiment, a frequency of the signal of the source power may be from about 40 MHz to about 200 MHz or less, but the inventive concept is not limited thereto. In an example embodiment, a period of the signal of the source power may be about 0.5 ns or more and about 2.5 ns or less, but the inventive concept is not limited thereto. As used herein, terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first power source 141 may be coupled (e.g., electrically connected) to the gas distribution device 130 by the first matching network 145. For example, the first matching network 145 may increase transmission efficiency of high frequency power supplied by the first power source 141 by reducing reflected power. The first matching network 145 may include, for example, a matching box and a band pass filter. As used herein, components described as being "electrically connected" are configured such that an electrical signal can be transferred from one component to the other (although such electrical signal may be attenuated in strength as it is transferred and may be selectively transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

In an example embodiment, the substrate supporter 150 may be an electrostatic chuck. The plasma processing apparatus 100 may further include an electrostatic clamping system configured to provide a clamping voltage for fixing the substrate W to the substrate supporter 150. However, the inventive concept is not limited thereto, and the substrate supporter 150 may be a vacuum chuck fixing the substrate W using vacuum pressure.

The second power source 161 may be electrically connected to the substrate supporter 150. The second power source 161 may generate sinusoidal or non-sinusoidal bias power while the substrate W is processed, and the second power source 161 may provide the power to the substrate supporter 150. The bias power generated by the second power source 161 may supply energy (e.g., electromagnetic energy) to the plasma PLA.

In example embodiments, a frequency of a signal of the bias power generated by the second power source 161 may range from 100 kHz to 3 MHz. In certain example embodiments, a frequency of the signal of the bias power generated by the second power source 161 may range from 400 kHz to 2 MHz.

The second power source 161 may be coupled (e.g., electrically connected) to the substrate supporter 150 by the second matching network 165. For example, the second matching network 165 may increase transmission efficiency of high frequency power supplied by the second power source 151 by reducing reflected power. When the second power source 161 supplies non-sinusoidal, the second matching network 165 may include a plurality of matching boxes and a plurality of band pass filters corresponding to different frequency bands.

The exhaust device 170 may depressurize the chamber space by discharging the processing gas from the chamber space. The exhaust device 170 may include a pump device (e.g., a pump). As a first example, the exhaust device 170 may include a turbo-molecular vacuum pump (TMP) and a gate valve for throttling/controlling chamber pressure. As a second example, the exhaust device 170 may include a mechanical booster pump and/or a dry roughing pump.

The controller 180 may control operations of the gas supply device 120, the first power source 141, the substrate supporter 150, the second power source 161 and the exhaust device 170. The controller 180 may be implemented by hardware, firmware, software, or a combination thereof. For example, the controller 180 may include a computing device such as a workstation computer, a desktop computer, a laptop computer, and a tablet computer. The controller 180 may include a processor such as a microprocessor, CPU, GPU, or the like, a processor configured by software, dedicated hardware, or firmware. The controller 180 may be implemented by, for example, a general-purpose computer or application-specific hardware such as a digital signal processor (DSP), field programmable gate array (FPGA) and application specific integrated circuit (ASIC). When a component is described as "including" a particular element or group of elements, it is to be understood that the component is formed of only the element or the group of elements, or the element or group of elements may be combined with additional elements to form the component, unless the context clearly and/or explicitly describes the contrary.

In an example embodiment, operations of the controller 180 may be implemented as instructions stored on a machine-readable medium which may be read and executed by one or more processors. Here, a machine-readable medium may include a mechanism for storing and/or transmitting information in a form readable by a machine (e.g., a computing device). For example, a machine-readable medium may include a read only memory (ROM), random access memory (RAM), a magnetic disk storage medium, an optical storage medium, a flash memory device, electrical radio signals, optical radio signals, acoustic radio signals, or other forms of radio signals (e.g., a carrier wave, infrared signals, digital signals, or the like,) and other arbitrary signals.

The plasma processing apparatus 100 may perform a plasma process by switching the processing gas supplied in the chamber to another processing gas. For example, the plasma processing apparatus 100 may perform a first process using a first processing gas, may switch the first processing gas to a second processing gas, and may perform a second process using the second processing gas.

In the case in which it takes a long time to switch the processing gas, the completion time of the entire process may increase and productivity of the plasma processing apparatus 100 may decrease. For example, in the case in which the gas supply device 120 may start supplying the second processing gas after terminating the supply of the first processing gas in order to switch the first processing gas to the second processing gas, it may take the time for the second processing gas to reach the internal region of the chamber. Also, internal pressure of the chamber may fluctuate due to various factors while the processing gas is switched, and it may take time for the pressure to stabilize.

According to an example embodiment, the gas supply device 120 may include a plurality of flow ratio controllers configured to output different processing gases according to a predetermined flow ratio. For example, the gas supply device 120 may discharge the second processing gas through a bypass pipe using a second flow ratio controller while providing the first processing gas into the chamber using the first flow ratio controller. Also, the gas supply device 120 may swiftly switch the processing gas provided in the chamber from the first processing gas to the second processing gas by connecting the second flow ratio controller to the internal region of the chamber and connecting the first flow ratio controller to the bypass pipe.

Also, the bypass pipe may be provided with a conductance control valve for controlling the conductance (e.g., a fluid conductance) of the bypass pipe, and the gas supply device 120 may control a conductance control valve such that changes in internal pressure of the chamber may be suppressed at a time point at which the processing gas is switched (e.g., a starting point of the switch).

According to an example embodiment, the gas supply device 120 included in the plasma processing apparatus 100 may swiftly switch the processing gas and may suppress changes in internal pressure of the chamber, thereby shortening the stabilization period and the completion time of the entire process, and improving productivity of the plasma processing apparatus 100.

Figure 2:
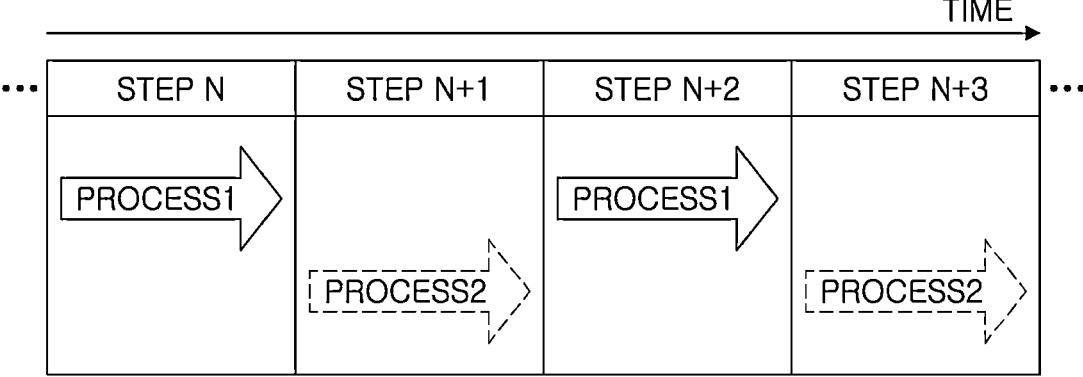
FIG. 2 is a diagram illustrating a process order of a plasma processing apparatus according to an example embodiment of the present disclosure.

FIG. 2 is a diagram illustrating a process order of a plasma processing apparatus according to an example embodiment.

The plasma processing apparatus 100 as described with reference to FIG. 1 may repeatedly perform a plurality of processes. For example, the plasma processing apparatus 100 may prevent a membrane/film from being collapsed in the vicinity of an opening by repeatedly performing a first process Process 1 of forming the opening by etching a portion exposed from a photoresist film formed on an upper surface of substrate W and a second process Process 2 of depositing a passivation layer on a sidewall of the opening, and the opening may be formed at a desired depth by repeating the first process and the second process. In the example in FIG. 2, the first process may be performed in an Nth operation, the second process may be performed in an (N+1)th operation, the first process may be performed in an (N+2)th operation, and the second process may be performed in the (N+3)th operation, such that in each process, the first process and the second process may be performed alternately (N is a natural number).

A first processing gas used in the first process and a second processing gas used in the second process may be different. The gas supply device 120 may switch the processing gas in each process such that the first process and the second process may be performed alternately. Each process may be performed after the switched processing gas sufficiently flows into the chamber and the stabilization period, the period until the internal pressure of the chamber is stabilized, has elapsed. In the case in which the gas supply device 120 swiftly switch the processing gas, the stabilization time in each process may be shortened, and accordingly, the completion time of the entire process may be shortened.

In the case in which the gas supply device includes only one flow ratio controller, switching of the processing gas may be performed using the only one flow ratio controller so that the stabilization period for the processing gas to sufficiently flow into the chamber and for the internal pressure of the chamber to stabilize may take a long time.

Figure 3:
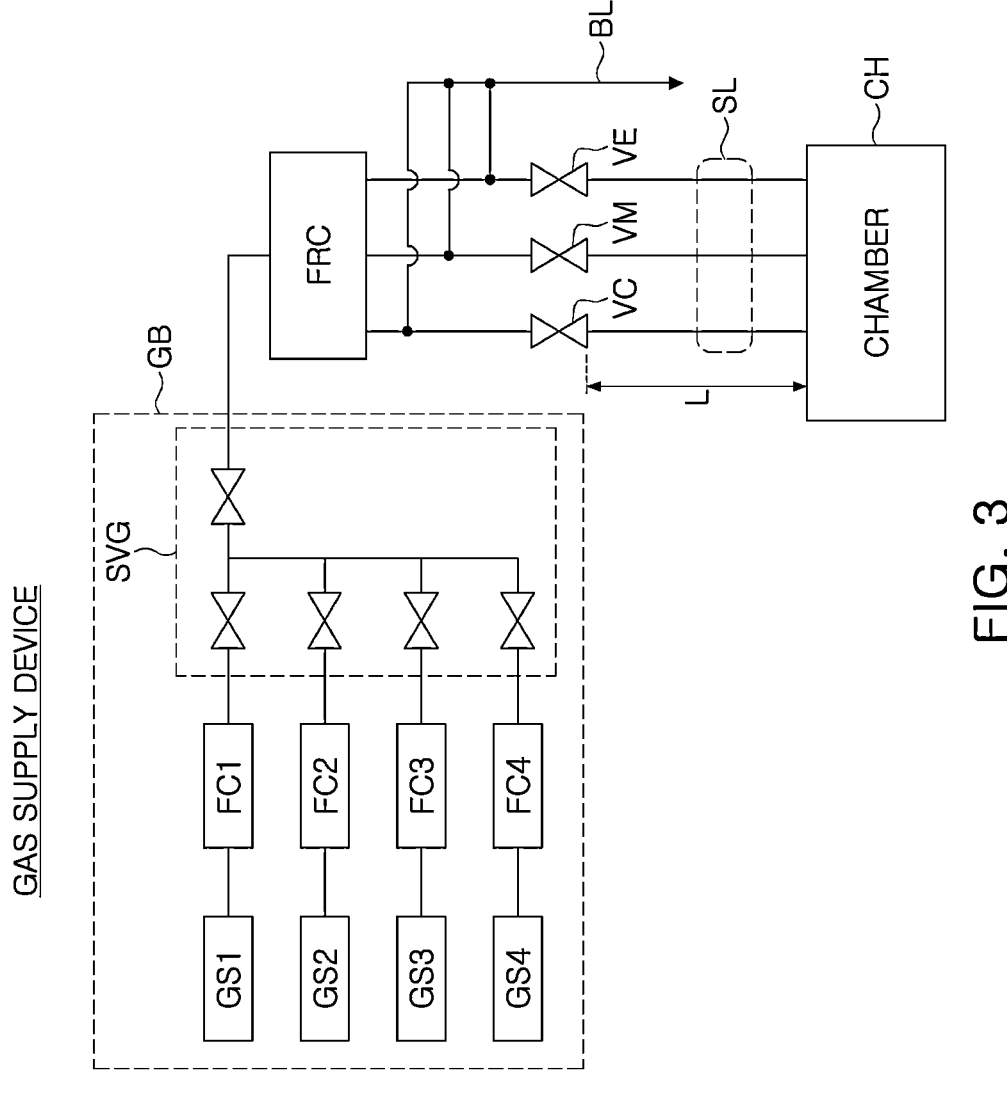
FIG. 3 is a diagram illustrating a gas supply device according to a comparative example different from an example embodiment.

FIG. 3 is a diagram illustrating a gas supply device according to a comparative example different from example embodiments.

The gas supply device according to the comparative example may include a gas box GB, a flow ratio controller FRC, a plurality of supply valves VC, VM, and VE, a plurality of supply pipes SL and a bypass pipe BL.

The gas box GB may provide a processing gas output by at least one of a plurality of gas sources to the flow ratio controller FRC. The gas box GB may include the plurality of gas sources GS1, GS2, GS3, and GS4, a plurality of flow rate controllers FC1, FC2, FC3, and FC4 and a source valve group SVG.

The plurality of gas sources GS1-GS4 may store different types of processing gases used in the plasma process. The plurality of flow rate controllers FC1-FC4 may control flow rates of the processing gases output by the plurality of gas sources GS1-GS4 and provide the gases to the source valve group SVG.

The source valve group SVG may selectively output different types of processing gases output by the plurality of flow rate controllers FC1-FC4 to the flow ratio controller FRC. For example, the source valve group SVG may include a plurality of valves connected to a pipe between the plurality of flow rate controllers FC1-FC4 and the flow ratio controller FRC. The plurality of valves may provide a single gas or a mixed gas at a flow rate predetermined by the flow ratio controller FRC by being selectively opened and closed.

The flow ratio controller FRC may distribute the processing gas output by the gas box GB at a predetermined ratio and may output the gas to a plurality of output pipes. The plurality of output pipes may branch into a plurality of supply pipes SL and a bypass pipe BL. The plurality of supply pipes SL may be provided with a plurality of supply valves VC, VM, and VE. When the plurality of supply valves VC, VM, and VE are opened, the processing gas output by the flow ratio controller FRC may be supplied to each space (e.g., central, peripheral, or outer space) of the chamber CH at a predetermined ratio, and in a state the plurality of supply valves VC, VM, and VE are closed, the processing gas output by the flow ratio controller FRC may be discharged through the bypass pipe BL.

In a gas supply device such as the example described with reference to FIG. 3, it may take a long time to switch the processing gases. For example, in order to switch the first processing gas stored in the first gas source GS1 to the second processing gas stored in the second gas source GS2, the gas supply device may block the first processing gas by controlling the source valve group SVG, may supply the second processing gas to the flow ratio controller FRC, and by controlling the flow ratio controller FRC, the second processing gas may be provided to each space (e.g., central, peripheral, or outer space) of the chamber CH according to the predetermined flow ratio. The plurality of supply pipes between the plurality of supply valves VC, VM, and VE and the chamber CH may have a sufficient length, for example, 1 meter or more. Accordingly, it may take a long time for the second processing gas to be output by the second gas source GS2 to reach the chamber CH through the flow ratio controller FRC.

While the first processing gas is switched to the second processing gas in the chamber CH, it may take a long time for the pressure to stabilize in the chamber CH.

Figure 4A:
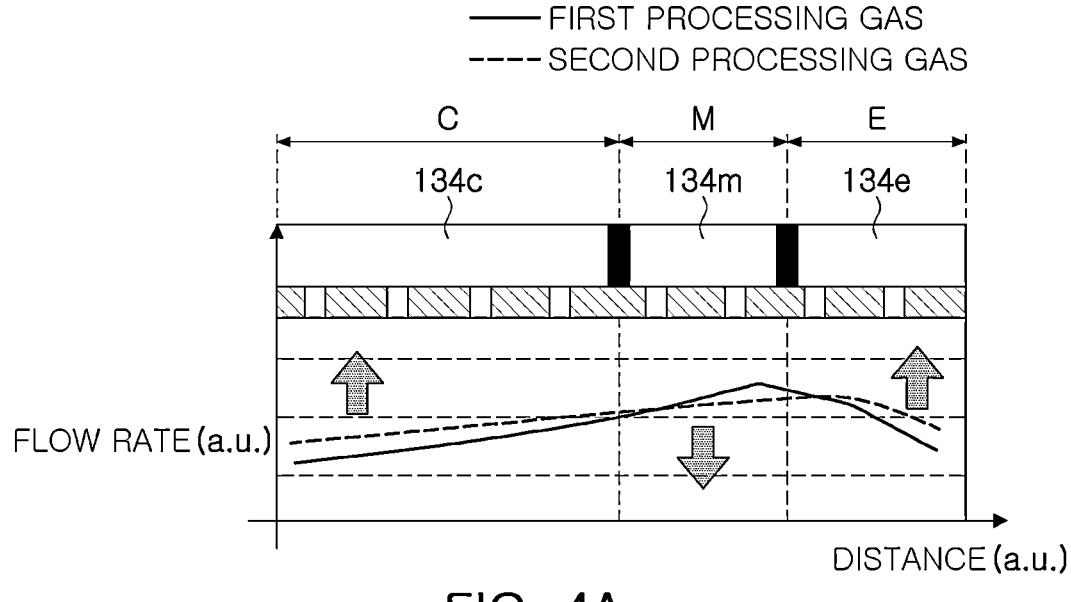
FIGS. 4A and 4B are diagrams illustrating fluctuations in pressure of a gas supply device according to a comparative example.
Figure 4B:
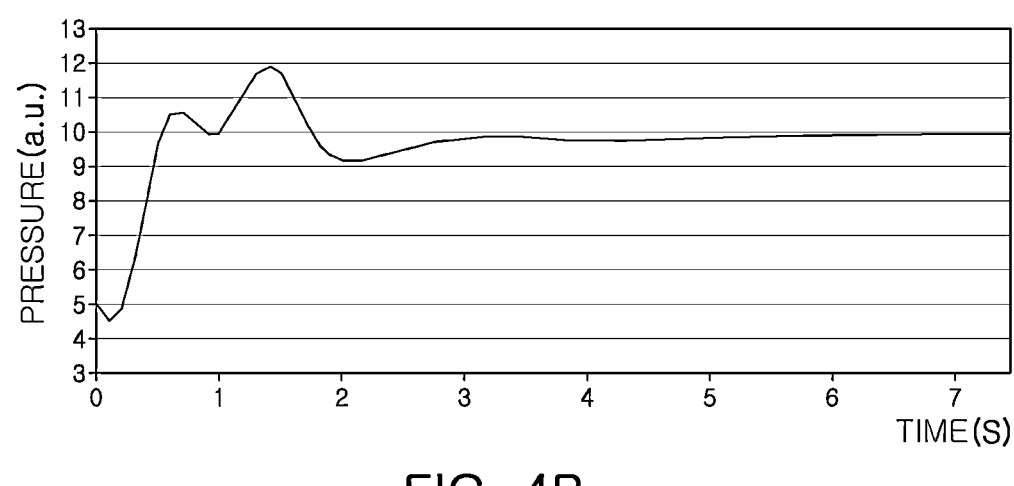

FIGS. 4A and 4B are diagrams illustrating fluctuations in pressure of a gas supply device according to a comparative example.

FIG. 4A illustrates distribution of a flow rate of processing gas depending on a distance from a center of a substrate W in a chamber. The chamber space may include a central region C, a peripheral region M, and an outer region E configured to obtain gas from a central space 134c, a peripheral space 134m, and an outer space 134e of the diffusion chamber 134, respectively.

A flow ratio controller FRC, as described with reference to FIG. 3, may control a flow ratio of gas flowing into each portion of the chamber. Depending on types of processing gas, a target flow ratio of the gas may also vary. FIG. 4A illustrates distribution of flow rate of the first processing gas and the second processing gas. Referring to FIG. 4A, distribution of flow rate for each region of the first processing gas and the second processing gas may be different. To switch the first processing gas to the second processing gas, the flow ratio controller FRC may increase a flow rate of processing gas supplied to the central region C, may decrease a flow rate of processing gas supplied to the peripheral region M, and may increase a flow rate of processing gas supplied to the outer region E.

While the flow ratio controller FRC switches the processing gas, a flow rate and a flow ratio of the processing gas supplied to each region in the chamber may change, so that internal pressure of the chamber may change.

FIG. 4B illustrates changes in internal pressure of the chamber over time from a time point at which the processing gas is switched (e.g., a starting point of the switch). The internal pressure of the chamber may change by various causes such as a flow rate of processing gas, a flow ratio of processing gas for each region in the chamber, the type of processing gas to be switched, and a difference in flow ratios of the processing gas before switching and the processing gas to be switched. In the example in FIG. 4B, it may take more than 2 seconds for the internal pressure of the chamber to stabilize from the time point at which the processing gas is switched (e.g., from the starting point of switch).

The instability of internal pressure of the chamber may have a negative effect on quality of the plasma process. For example, an etch rate in an etching process may vary depending on the internal pressure of the chamber. In the case in which the etching process is performed while the internal pressure of the chamber is unstable, the substrate W may be over-etched or under-etched as compared to the targeted amount of etching, such that quality of the substrate W generated in the etching process may deteriorate.

In the case in which the process is delayed until the internal pressure of the chamber is sufficiently stabilized after switching the processing gas, quality of the plasma process may be improved, but the time required for the entire process may increase.

In the description below, the gas supply device 120, which may reduce the time required for the entire process by swiftly switching processing gas and suppressing changes in internal pressure of the chamber, will be described in greater detail.

Figure 5:
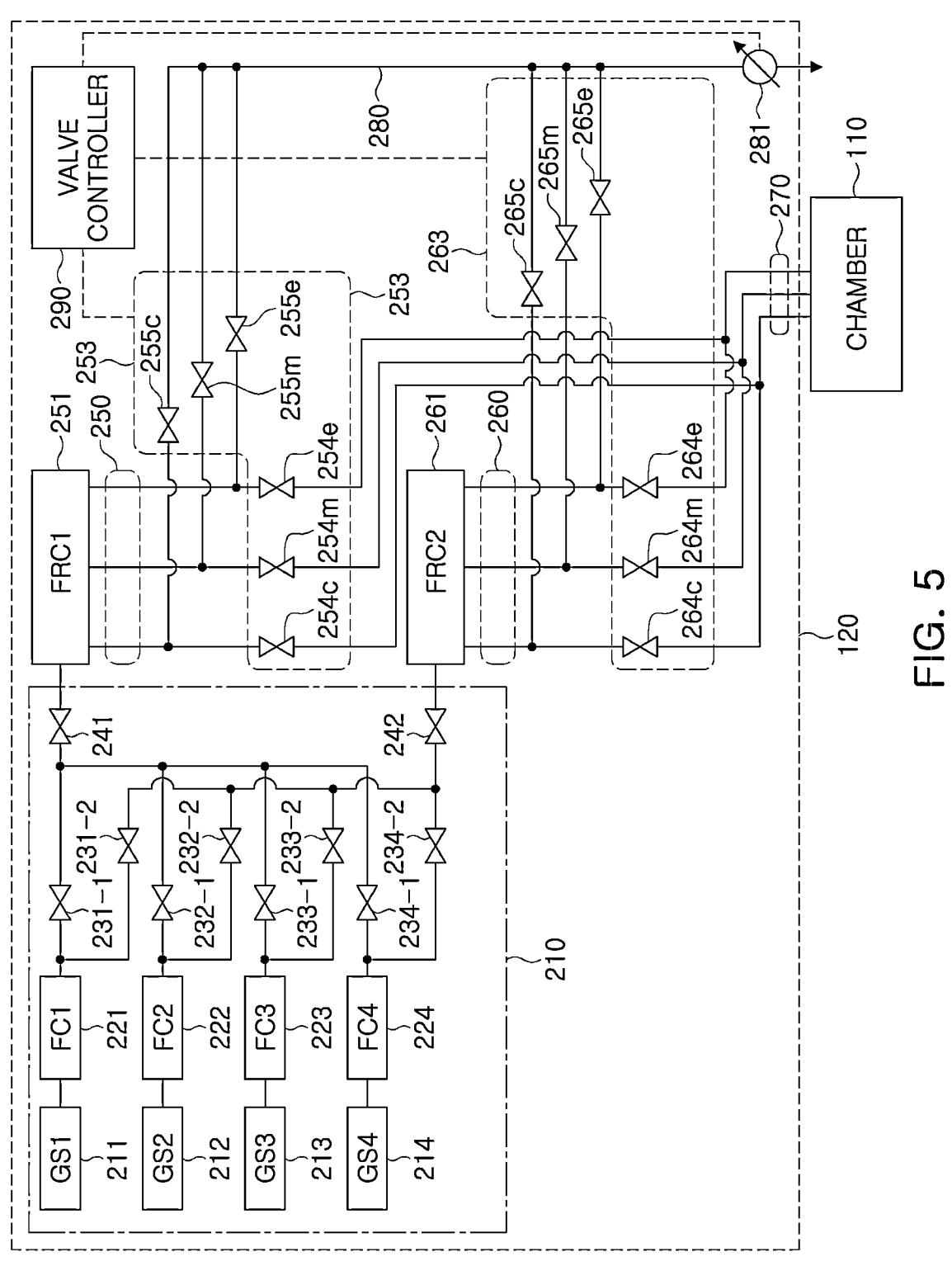
FIG. 5 is a diagram illustrating a gas supply device according to an example embodiment of the present disclosure.

FIG. 5 is a diagram illustrating a gas supply device according to an example embodiment.

Referring to FIG. 5, the gas supply device 120 may include a gas box 210, a plurality of first output pipes 250, a first flow ratio controller 251, a first switching valve set 253, a plurality of second output pipes 260, a second flow ratio controller 261, a second switching valve set 263, a plurality of supply pipes 270, a bypass pipe 280, a conductance control valve 281 and a valve controller 290.

The gas box 210 may provide a first processing gas output by the plurality of gas sources to the first flow ratio controller 251 and a second processing gas output by the plurality of gas sources to the second flow ratio controller 261. In an example embodiment, each of the first processing gas and the second processing gas may be a single gas or a mixed gas. The first processing gas and the second processing gas may be different gases or may include different gases.

The gas box 210 may include a plurality of gas sources 211, 212, 213, and 214, a plurality of flow rate controllers 221, 222, 223, and 224, and a plurality of first source valves 231-1, 231-2, 232-1, 232-2, 233-1, 233-2, 234-1, and 234-2 and a plurality of second source valves 241 and 242. Although not illustrated in FIG. 5, the gas box 210 may further include a bypass pipe discharging at least a portion of the processing gas to control pressure of the pipe.

The plurality of gas sources 211-214 may store different types of processing gas used in the plasma process. The plurality of flow rate controllers 221-224 may control a flow rate of processing gas output by the plurality of gas sources 211-214 and provide the gas to the first source valves 231-1-234-2. In an example embodiment, the plurality of flow rate controllers 221-224 may include a mass flow controller (MFC) configured to control a flow rate based on mass of the gas.

The first source valves 231-1-234-2 may selectively output the processing gas output by the plurality of flow rate controllers 221-224 to the second source valves 241 and 242. The second source valves 241 and 242 may provide a single gas or a mixture of single gases output by the first source valves 231-1-234-2, respectively, to the first flow ratio controller 251 and the second flow ratio controller 261.

The first flow ratio controller 251 may distribute the first processing gas output by the gas box 210 at a predetermined ratio and may output the gas to the plurality of first output pipes 250. The plurality of first output pipes 250 may be branched into the plurality of supply pipes 270 and the bypass pipe 280. The plurality of supply pipes 270 may be connected to the plurality of regions of the chamber 110 through a central space 134c, a peripheral space 134m and an outer space 134e, and the bypass pipe 280 may be connected to an external entity/device outside the chamber. For example, the chamber 110 may include a central region, a peripheral region and an outer region.

A first switching valve set 253 may be provided between the plurality of first output pipes 250 and the plurality of supply pipes 270, and between the plurality of first output pipes 250 and the bypass pipe 280. The first switching valve set 253 may, by connecting the plurality of supply pipes 270 or the bypass pipe 280 to the plurality of first output pipes 250, provide the first processing gas output by the plurality of first output pipes 250 to the chamber 110 through the plurality of supply pipes 270 or discharge the gas to the bypass pipe 280.

In the example in FIG. 5, the first switching valve set 253 may include first supply valves 254c, 254m, and 254e connected between the plurality of first output pipes 250 and the plurality of supply pipes 270, and a plurality of first bypass valves 255c, 255m, and 255e connected between the first output pipes 250 and the bypass pipe 280. The first supply valves 254c, 254m, and 254e and the first bypass valves 255c, 255m, and 255e may be opened or closed complementarily. For example, when the first supply valves 254c, 254m, and 254e are opened, the first bypass valves 255c, 255m, and 255e may be closed, and when the first supply valves 254c, 254m, and 254e are closed, the first bypass valves 255c, 255m, and 255e may be opened.

The second flow ratio controller 261 may distribute the second processing gas output by the gas box 210 at a predetermined ratio and may output the gas to the plurality of second output pipes 260. The plurality of second output pipes 260 may be branched into the plurality of supply pipes 270 and the bypass pipe 280.

The second switching valve set 263 may be provided between the plurality of second output pipes 260 and the plurality of supply pipes 270, and between the plurality of second output pipes 260 and the bypass pipe 280. The second switching valve set 263 may, by connecting the plurality of supply pipes 270 or the bypass pipe 280 to the plurality of second output pipes 260, provide the second processing gas output by the plurality of second output pipes 250 to the chamber 110 through the plurality of supply pipes 270 or discharge the gas to the bypass pipe 280.

In the example in FIG. 5, the second switching valve set 263 may include second supply valves 264c, 264m, 264e connected between the plurality of second output pipes 260 and the plurality of supply pipes 270, and the plurality of second bypass valves 265c, 265m, 265e connected between the second output pipes 260 and the bypass pipe 280. The second supply valves 264c, 264m, and 264e and the second bypass valves 265c, 265m, and 265e may be opened or closed complementarily.

The bypass pipe 280 may include a conductance control valve 281 which may control conductance of the bypass pipe 280. Conductance may refer to ability of a pipe to pass the gas during a predetermined period of time.

The valve controller 290 may control opening and closing of the first switching valve set 253 and the second switching valve set 263, and may control conductance of the conductance control valve 281. The valve controller 290 may be included in the controller 180 described with reference to FIG. 1, and may be implemented as hardware, firmware, software, or a combination thereof separately from the controller 180.

According to an example embodiment, the valve controller 290 may swiftly perform switching between the first processing gas and the second processing gas by controlling the first switching valve set 253, the second switching valve set 263 and the conductance control valve 281, and may suppress changes in internal pressure of the chamber 110.

In the description below, referring to FIGS. 6A and 6B, the method of switching between the first processing gas and the second processing gas by the gas supply device 120 will be described in greater detail.

Figures 6A, 6B:
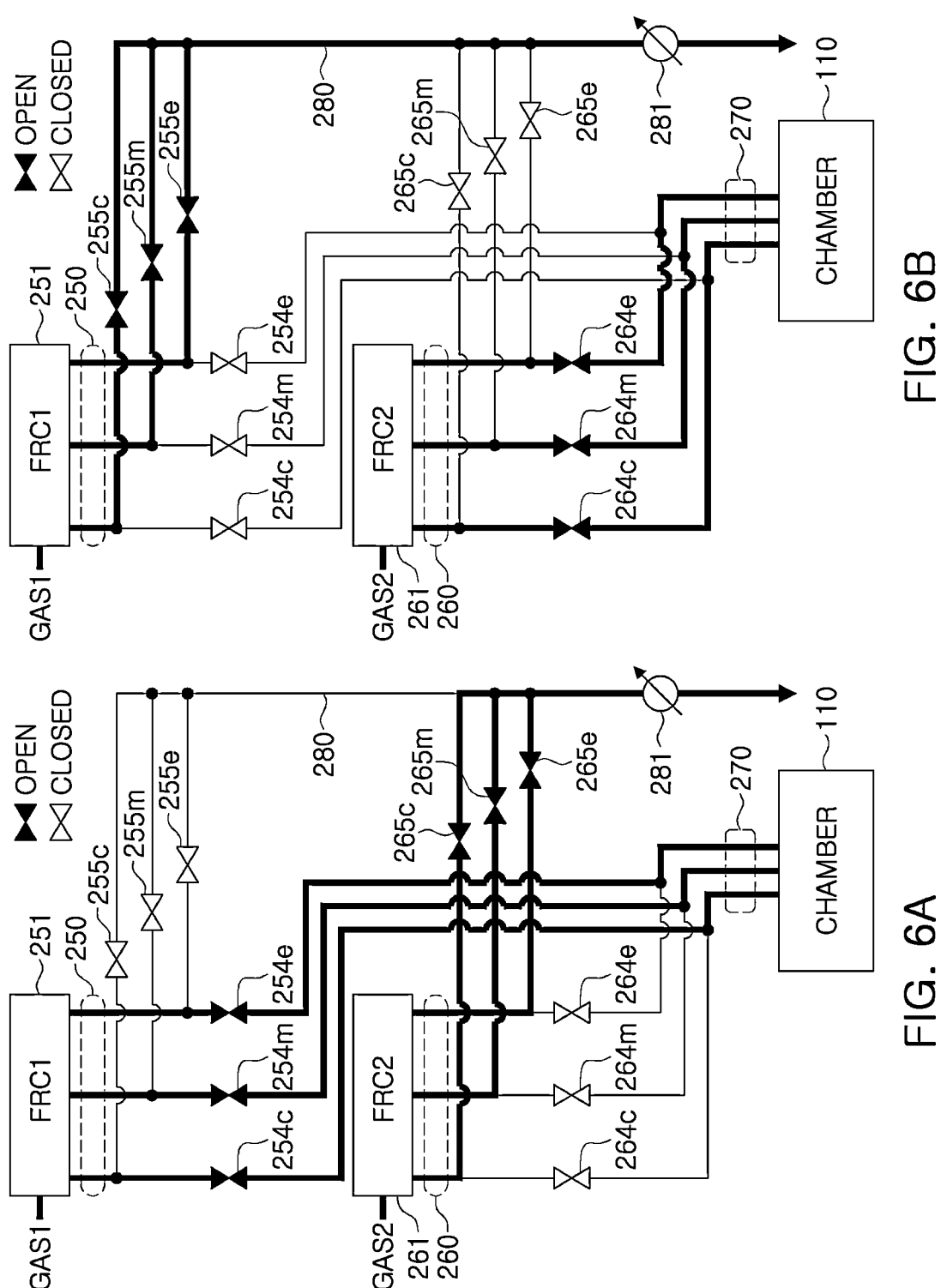
FIGS. 6A and 6B are diagrams illustrating operations of a gas supply device according to an example embodiment of the present disclosure.

FIGS. 6A and 6B are diagrams illustrating operations of a gas supply device according to an example embodiment.

FIG. 6A illustrates an operation in which the gas supply device 120 described with reference to FIG. 5 supplies a first processing gas to a chamber, and FIG. 6B illustrates an operation in which the gas supply device 120 described with reference to FIG. 5 supplies a second processing gas to the chamber.

Referring to FIG. 6A, the first flow ratio controller 251 may output the first processing gas GAS1 output by a gas box to a plurality of first output pipes 250 according to a first flow ratio, and the second flow ratio controller 261 may output the second processing gas GAS2 output by the gas box to a plurality of second output pipes 260 according to a second flow ratio. The first flow ratio and the second flow ratio may be defined in process recipes of a first process using a first processing gas GAS1 and a second process using a second processing gas GAS2

A valve controller 290, as described with reference to FIG. 5, may connect the plurality of first output pipes 250 to the plurality of supply pipes 270 by opening the plurality of first supply valves 254c, 254m, and 254e, and may block pipes/paths between the plurality of first output pipes 250 and the bypass pipe 280 by closing the plurality of first bypass valves 255c, 255m, and 255e. Accordingly, the first processing gas GAS1 may be provided to each region in the chamber 110 according to a first flow ratio. For example, the first processing gas GAS1 may be provided to the chamber 110 with different flow rates depending on the regions of the chamber 110 through the plurality of first output pipes 250 and the plurality of supply pipes 270.

The valve controller 290 may block pipes/paths between the plurality of second output pipes 260 and the plurality of supply pipes 270 by closing the plurality of second supply valves 264c, 264m, and 264e, and by opening the plurality of second bypass valves 265c, 265m, and 265e, the plurality of second output pipes 260 may be connected to the bypass pipe 280. Accordingly, the second processing gas GAS2 output by the second flow ratio controller 261 to the second output pipes 260 according to the second flow ratio may be discharged through the bypass pipe 280.

For example, the gas supply device 120 may discharge the second processing gas GAS2 through the second flow ratio controller 261 and the bypass path 280 while the first processing gas GAS1 is supplied into the chamber 110.

When the gas supply device 120 switches the processing gas supplied into the chamber from the first processing gas to the second processing gas, the state of the gas supply device 120 may be switched from the state illustrated in FIG. 6A to the state illustrated in FIG. 6B.

Referring to FIG. 6B, as described with reference to FIG. 6A, the first flow ratio controller 251 may output the first processing gas GAS1 output by the gas box to a plurality of first output pipes 250 according to the first flow ratio, and the second flow ratio controller 261 may output the second processing gas GAS2 output by the gas box to the plurality of second output pipes 260 according to the second flow ratio.

According to an example embodiment, the gas supply device 120 may switch the processing gas supplied into the chamber from the first processing gas to the second processing gas by controlling only the switching states of the first switching valve set and the second switching valve set.

For example, the valve controller 290 may block pipes/ paths between the plurality of first output pipes 250 and the plurality of supply pipes 270 by closing the plurality of first supply valves 254c, 254m, and 254e, and by opening the plurality of first bypass valves 255c, 255m, and 255e, the plurality of first output pipes 250 may be connected to the bypass pipe 280. Accordingly, the first processing gas GAS1 may be discharged through the bypass pipe 280.

The valve controller 290 may connect the plurality of second output pipes 260 to the plurality of supply pipes 270 by opening the plurality of second supply valves 264c, 264m, and 264e, and by closing the plurality of second bypass valves 265c, 265m, and 265e, the valve controller 290 may block pipes/paths between the plurality of second output pipes 260 and the bypass pipe 280. Accordingly, the second processing gas GAS2 may be provided to each region in the chamber depending on a second flow ratio. For example, the second processing gas GAS2 may be provided to the chamber 110 with different flow rates depending on the regions of the chamber 110 through the plurality of second output pipes 260 and the plurality of supply pipes 270.

According to an example embodiment, while the gas supply device 120 supplies the first processing gas GAS1 into the chamber, the second processing gas GAS2 may be output by the second flow ratio controller 261 according to the second flow ratio. Accordingly, the gas supply device 120 may change the type of processing gas output by the gas box at a time point at which the gas supply device 120 switches the first processing gas GAS1 to the second processing gas GAS2, and it may not be necessary to adjust a flow ratio of the processing gas output by the flow ratio controller, e.g., by individually adjusting flow rates of each gas. The gas supply device 120 may switch the first processing gas GAS1 to the second processing gas GAS2 by switching only the switching states of the first switching valve set and the second switching valve set. For example, the gas supply device 120 may switch flow ratios of gases by switching pipes/paths of preset ratios of processing gases without adjusting flow rates of individual gases.

Similarly, when the gas supply device 120 switches the second processing gas GAS2 to the first processing gas GAS1, by switching the switching states of the first switching valve set and the second switching valve set, the second processing gas GAS2 may be switched to (e.g., replaced with) the first processing gas GAS1.

Accordingly, the time for the gas supply device 120 to switch the processing gas may be shortened, the time for the plasma processing apparatus 100 to complete the entire process may be shortened, and productivity of the plasma processing apparatus 100 may be improved.

FIGS. 5, 6A and 6B illustrate the example in which the switching valve set may include supply valves and bypass valves implemented as 2-way valves, but the inventive concept is not limited thereto. The switching valve set may also be implemented as 3-way valves.

Figure 7:
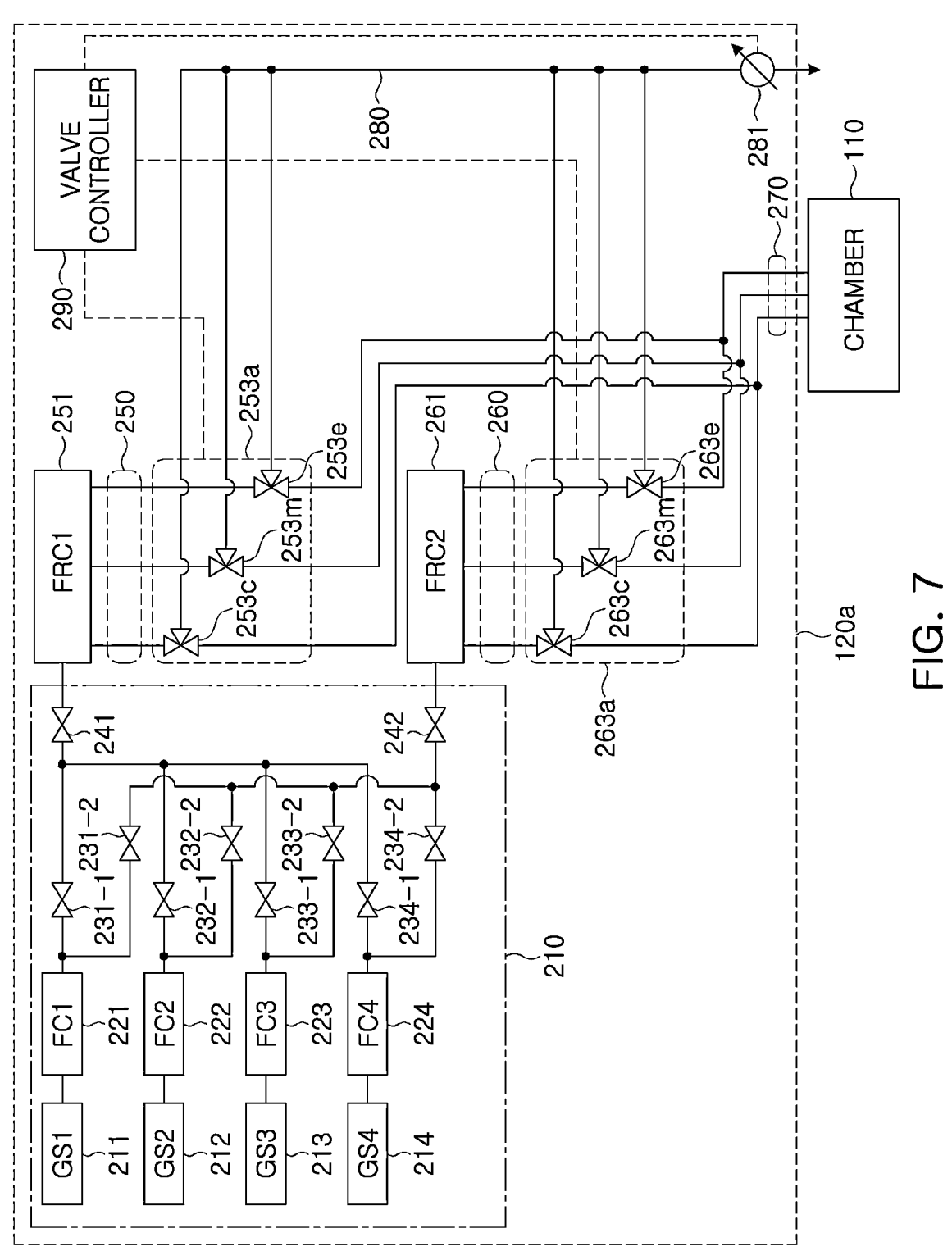
FIG. 7 is a diagram illustrating a gas supply device according to an example embodiment of the present disclosure.

FIG. 7 is a diagram illustrating a gas supply device according to an example embodiment.

Referring to FIG. 7, a gas supply device 120a may be the same as the gas supply device 120 described with reference to FIG. 5, other than a first switching valve set 253a and a second switching valve set 263a. In the description below, the structure of the gas supply device 120a will be described with respect to differences from the gas supply device 120.

The first switching valve set 253a may include first switching valves 253c, 253m, and 253e provided between a plurality of first output pipes 250 and a plurality of supply pipes 270, and between a plurality of first output pipes 250 and a bypass pipe 280. The second switching valve set 263a may include second switching valves 263c, 263m, and 263e provided between a plurality of second output pipes 260 and a plurality of supply pipes 270, and between a plurality of second output pipes 260 and the bypass pipe 280. The first switching valves 253c, 253m, and 253e and the second switching valves 263c, 263m, and 263e may be implemented as 3-way valves.

According to an example embodiment, a first flow ratio controller 251 may output a first processing gas to a plurality of first output pipes 250 at a first flow ratio, and the second flow ratio controller 261 may output a second processing gas to the plurality of second output pipes 260 at a second flow ratio.

To supply the first processing gas to the chamber 110, the valve controller 290 of the gas supply device 120a may control the state of the first switching valves 253c, 253m, and 253e such that the plurality of first output pipes 250 and the plurality of supply pipes 270 may be connected to each other, and paths between the plurality of first output pipes 250 and the bypass pipe 280 may be blocked. Also, the valve controller 290 may control the state of the second switching valves 263c, 263m, and 263e such that paths between the plurality of second output pipes 260 and the plurality of supply pipes 270 may be blocked and the plurality of second output pipes 260 and the bypass pipe 280 may be connected.

To switch the processing gas supplied to the chamber 110 from the first processing gas to the second processing gas, the valve controller 290 may switch the states of the first switching valves 253c, 253m, and 253e and the second switching valves 263c, 263m, and 263e.

For example, to supply the second processing gas to the chamber 110, the valve controller 290 may control the state of the second switching valves 263c, 263m, and 263e such that the plurality of second output pipes 260 and the plurality of supply pipes 270 are connected, and paths between the plurality of second output pipes 260 and the bypass pipe 280 may be blocked. Also, the valve controller 290 may control the state of the first switching valves 253c, 253m, and 253e such that the plurality of first output pipes 250 are blocked from the plurality of supply pipes 270, and the plurality of first output pipes 250 may be connected to the bypass pipe 280. In the case of the gas supply device 120a in FIG. 7, as in the gas supply device 120 described with reference to FIG. 5, the states of the first switching valves 253c, 253m, and 253e and the second switching valves 263c, 263m, and 263e may be switched such that switching of processing gas supplied to the chamber 110 may be performed swiftly.

In the description below, a method of suppressing changes in internal pressure of the chamber when the gas supply device 120 switches the processing gas supplied to the chamber 110 will be described in detail with reference to FIGS. 8 to 11.

Figures 8A, 8B:
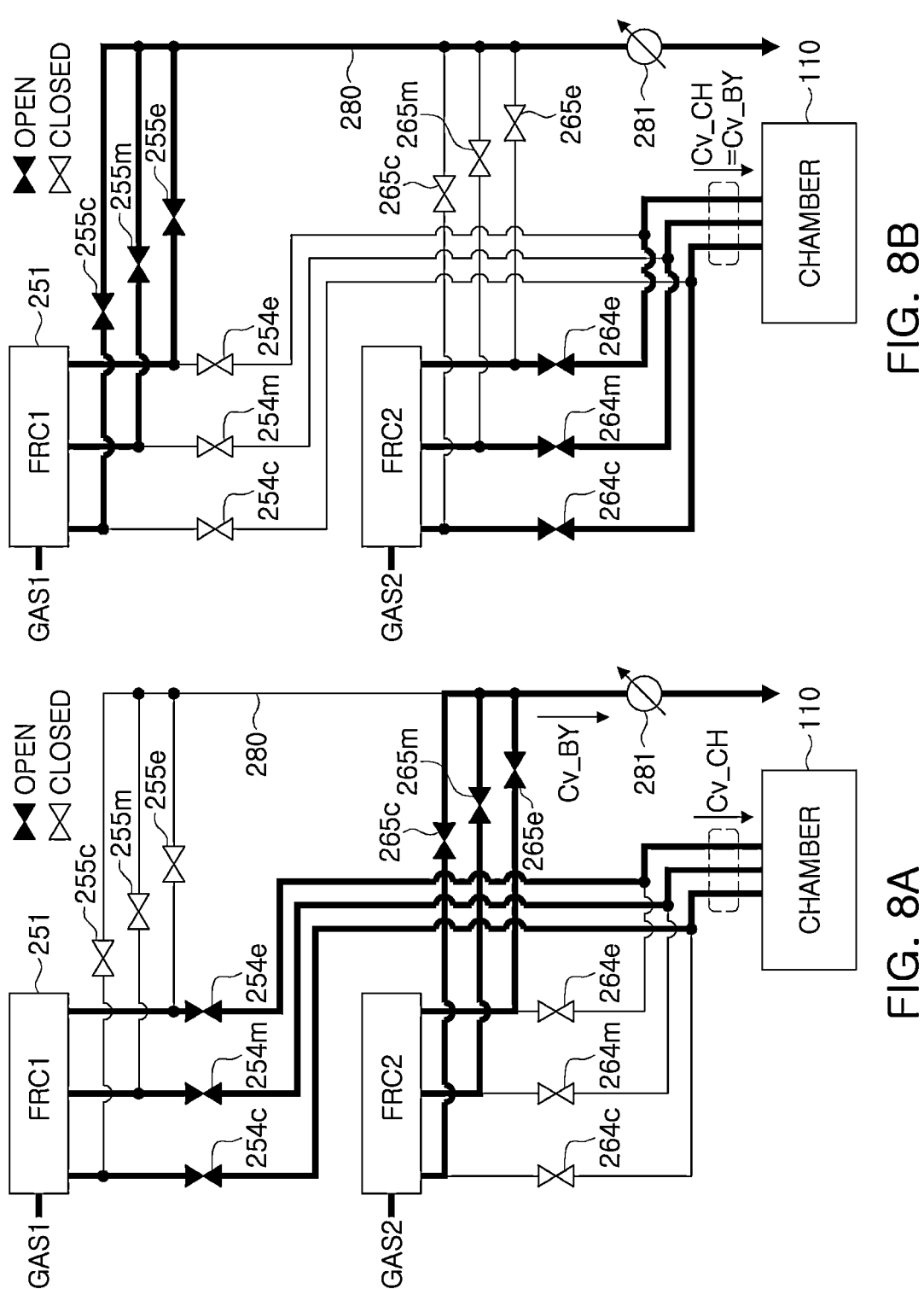
FIGS. 8A and 8B are diagrams illustrating control over conductance of a bypass pipe according to an example embodiment of the present disclosure.

FIGS. 8A and 8B are diagrams illustrating control over conductance of a bypass pipe according to an example embodiment.

FIGS. 8A and 8B illustrate the state of the gas supply device 120 in which the gas supply device 120 described with reference to FIG. 5 supplies a processing gas to the chamber, as in FIGS. 6A and 6B.

In addition to FIG. 6A, FIG. 8A illustrates first conductance Cv_CH of a plurality of supply pipes 270 and second conductance Cv_BY of a bypass pipe 280 when the gas supply device 120 supplies the first processing gas GAS1 to the chamber. The first conductance Cv_CH may be equal to a sum of levels of conductance of each of the plurality of supply pipes 270.

When the gas supply device 120 switches between the first processing gas GAS1 and the second processing gas GAS2, the first processing gas GAS1 flowing through the bypass pipe 280 having the second conductance Cv_BY may flow to the plurality of supply pipes 270. In the case in which the first conductance Cv_CH and the second conductance Cv_BY are different, when the first processing gas GAS1 is switched to the second processing gas GAS2, the amount of processing gas flowing into the chamber may vary and the internal pressure of the chamber may fluctuate. Similarly, when the second processing gas GAS2 is switched to the first processing gas GAS1, in the case in which the first conductance Cv_CH and the second conductance Cv_BY are different, internal pressure of the chamber may change.

According to an example embodiment, the conductance control valve 281 provided in the bypass pipe 280 may suppress changes in internal pressure of the chamber by controlling the second conductance Cv_BY of the bypass pipe 280 to be equal to the first conductance Cv_CH of the plurality of supply pipes 270. The conductance control valve 281 may be controlled by a valve controller 290 as described with reference to FIG. 5.

According to an example embodiment, the gas supply device 120 may control the second conductance Cv_BY on the bypass pipe 280 without limiting conductance of a supply path until a processing gas output by a gas box is supplied into the chamber. For example, the gas supply device 120 may be controlled such that the first conductance Cv_CH and the second conductance Cv_BY are the same without limiting the first conductance Cv_CH using a flow rate controller such as an orifice in the plurality of first output pipes 250, the plurality of second output pipes 260 and the plurality of supply pipes 270, thereby providing the processing gas smoothly into the chamber.

When the processing gas supplied in the chamber is switched, in the case in which the switched processing gas may be swiftly supplied in the chamber and the internal pressure of the chamber may be swiftly stabilized, the plasma process using the switched processing gas may start swiftly. Accordingly, productivity of the plasma processing apparatus 100 may be improved.

In the description below, the method of controlling conductance of the conductance control valve 281 according to an example embodiment will be described with reference to FIGS. 9 to 11.

Figure 9:
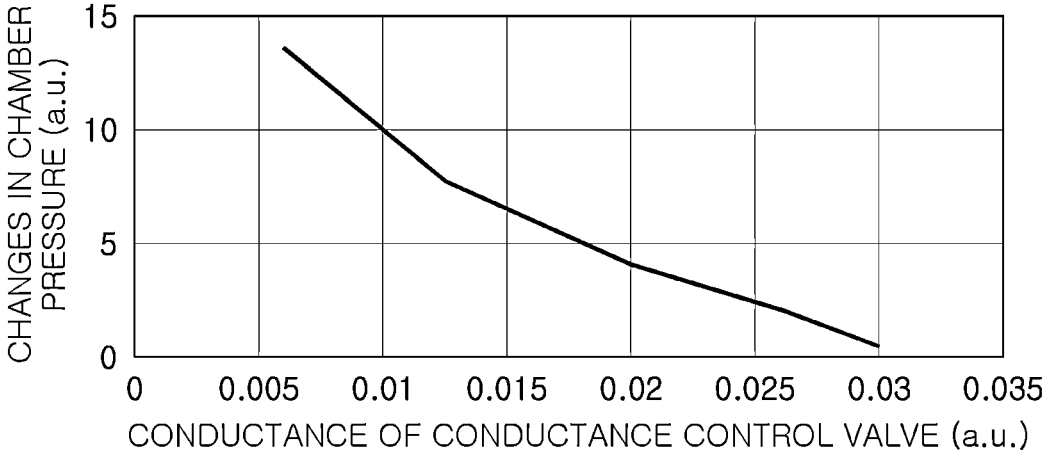
FIG. 9 is a diagram illustrating fluctuations in pressure of a chamber according to conductance of a bypass pipe according to an example embodiment of the present disclosure.

FIG. 9 is a diagram illustrating fluctuations in pressure of a chamber according to conductance of a bypass pipe according to an example embodiment.

The graph in FIG. 9 illustrates the amount of changes in internal pressure of the chamber according to conductance Cv of the conductance control valve 281. The amount of changes in internal pressure of the chamber may be determined by a difference between internal pressure of the chamber before the processing gas is switched and internal pressure of the chamber after the processing gas is switched.

Referring to FIG. 9, the amount of changes in internal pressure of the chamber may vary depending on the conductance Cv of the conductance control valve 281. For example, in the case in which the conductance Cv is 0.03 [a.u.], the amount of changes of internal pressure of the chamber may be suppressed close to 0.

As described with reference to FIGS. 8A and 8B, when the conductance of the conductance control valve 281 is the same as the conductance of the plurality of supply pipes 270, changes in internal pressure of the chamber may be suppressed/minimized.

In the case in which conductance of the plurality of supply pipes 270 needs to be measured directly to match (e.g., be the same as) the conductance of the conductance control valve 281, the plurality of supply pipes 270 may need to include a flow rate meter, and the flow rate meter may limit a flow rate of the plurality of supply pipes 270.

According to an example embodiment, the valve controller 290 may perform feedforward control and feedback control on the conductance control valve 281 based on various factors which determine the conductance of the plurality of supply pipes 270, the conductance of the conductance control valve 281 may be matched to (e.g., have the same value as) the conductance of the plurality of supply pipes 270 without directly measuring the conductance of the plurality of supply pipes 270. Accordingly, the gas supply device 120 may switch the processing gas swiftly.

Figure 10:
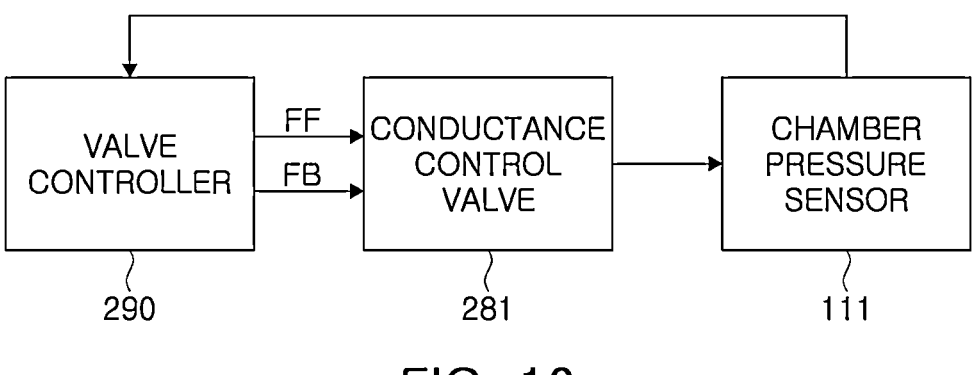
FIG. 10 is a diagram illustrating a method of controlling conductance of a bypass pipe according to an example embodiment of the present disclosure.

FIG. 10 is a diagram illustrating a method of controlling conductance of a bypass pipe according to an example embodiment.

FIG. 10 illustrates a conductance control valve 281, a valve controller 290, as described with reference to FIG. 5, and a chamber pressure sensor 111, as described with reference to FIG. 1.

According to an example embodiment, the valve controller 290 may control the conductance of the conductance control valve 281 by performing feedforward control FF and feedback control FB based on various factors.

For example, changes in internal pressure of the chamber may be affected by various factors such as the type of processing gas to be switched, a flow rate of processing gas to be switched, a flow ratio applied to the processing gas to be switched, a difference in flow rates between processing gas before switching and processing gas to be switched, current (e.g., real time) internal pressure of the chamber, an opening/closing rate of a VAT valve (or another vacuum valve) provided in an exhaust device of the chamber, and the like.

Among the various factors, factors such as the type of processing gas, the flow rate of processing gas, the flow ratio, the flow rate difference, and the opening/closing rate of the VAT valve (or another vacuum value) may be determined in advance. For example, the type of processing gas, the flow rate of the processing gas, and the flow ratio may be defined in a process recipe. Also, the current (e.g., real time) internal pressure of the chamber may vary depending on predetermined factors and the conductance of the conductance control valve 281.

According to an example embodiment, the valve controller 290 may perform feedforward control FF to control an initial value of the conductance of the conductance control valve based on the predetermined factors and the current internal pressure of the chamber when switching the processing gases. The valve controller 290 may obtain the predetermined factors by referring to the process recipe and may obtain current internal pressure of the chamber from the chamber pressure sensor 111.

The valve controller 290 may monitor the current internal pressure of the chamber according to the initial value of the conductance in real time from the chamber pressure sensor 111, and may further perform feedback control FB for adjusting the conductance of the conductance control valve 281 in a direction in which changes in internal pressure of the chamber is suppressed. For example, the valve controller 290 may receive the current internal pressure of the chamber through wired or wireless communication with the chamber pressure sensor 111.

Changes in internal pressure of the chamber may be influenced by the various factors mentioned above, but it may be difficult to define the effect of individual factors on changes in internal pressure of the chamber. For example, even in the case in which a flow rate of the processing gas to be switched is higher than a flow rate of the processing gas before being switched, the internal pressure of the chamber may not necessarily change in the direction of increase. Also, even when the internal pressure of the chamber fluctuates in the direction of increase, increasing the conductance of the conductance control valve 281 may suppress changes in pressure depending on various factors, and lowering the conductance may suppress changes in pressure.

An optimal initial value of the conductance of the conductance control valve 281 according to the combination of the various factors above may be experimentally determined. Also, an adjustment value of the conductance of the conductance control valve 281 may be experimentally determined according to a combination of the various factors.

According to an example embodiment, the valve controller 290 may obtain optimal values experimentally determined according to a combination of various factors and may control the conductance of the conductance control valve 281 using the obtained values. For example, optimal values according to a combination of the various factors above may be stored in an internal or external memory of the valve controller 290.

According to an example embodiment, the valve controller 290 may determine an optimal initial value and an adjustment value according to a combination of various factors using a machine learning model.

Figures 11, 12:
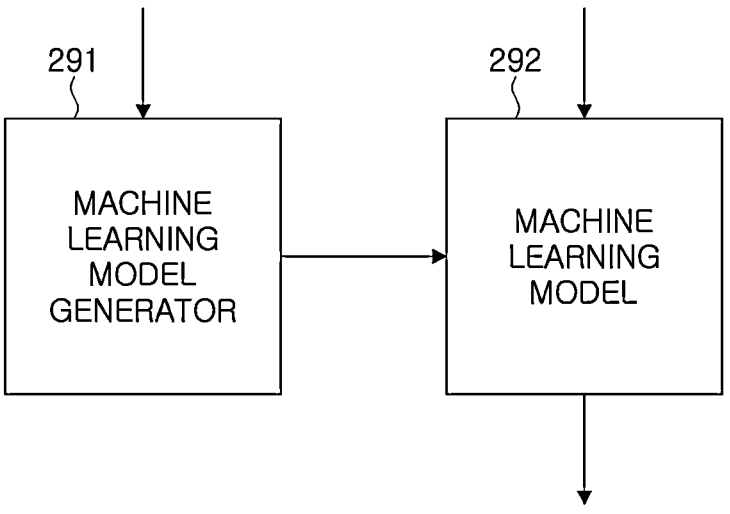
FIG. 11 is a diagram illustrating a valve controller according to an example embodiment of the present disclosure.
FIG. 12 is a diagram illustrating plasma density according to an example embodiment and a comparative example.

FIG. 11 is a diagram illustrating a valve controller according to an example embodiment.

Referring to FIG. 11, the valve controller 290 described with reference to FIG. 10 may include a machine learning model generator 291 and a machine learning model 292. The machine learning model generator 291 may perform machine learning to determine a function for determining an optimal initial value according to a combination of various factors and a function for determining an optimal adjustment value according to a combination of the various factors. For example, the machine learning model generator 291 may determine functions by performing supervised learning using the optimal initial value or the adjustment value experimentally determined according to a combination of various factors. However, the inventive concept is not limited thereto, and the machine learning model generator 291 may determine functions by performing other types of machine learning, such as reinforcement learning.

The machine learning model 292 may determine an initial value or an adjustment value using a machine learning model created based on machine learning model generator 291, e.g., a function to determine the initial value or the adjustment value according to a combination of various factors.

For example, the machine learning model 292 may obtain the values of various factors from the process recipe and the chamber pressure sensor 111, may determine the initial value of conductance, and may control the conductance control valve 281 such that the conductance may have an initial value.

The machine learning model 291 may monitor changes in internal pressure of the chamber from the chamber pressure sensor 111, may determine an adjustment value of conductance based on various factors including changes in pressure, and may adjust the conductance control valve 281 such that the conductance has the adjustment value.

In the description below, with reference to FIGS. 12 to 14, the effect of the gas supply device 120 according to an example embodiment will be in comparison with the effect of the gas supply device according to a comparative example described with reference to FIG. 3.

FIG. 12 is a diagram illustrating plasma density according to an example embodiment and a comparative example.

FIG. 12 illustrates a graph indicating density of plasma generated based on helium gas according to a process (e.g., a step) in an etching process in which the first process using hydrogen bromide (HBr) gas and the second process using helium (He) gas are alternatively performed.

FIG. 12 illustrates an Nth operation of performing a first process Process1 and a (N+1) th operation of performing a second process Process2. When each operation starts, a processing gas provided in the chamber may be switched. For example, to perform the (N+1) th operation, the processing gas may be switched from hydrogen bromide gas to helium gas. Each operation may initially include a stabilization period. For example, the plasma processing apparatus 100 may not form plasma using a processing gas during a stabilization period, and during a process period, plasma may be formed by applying a high-frequency power source to an upper electrode and a lower electrode as described with reference to FIG. 1.

According to a comparative example, the processing gas may be switched to helium gas, and helium gas may not sufficiently flow into a chamber even after a specified stabilization period has elapsed. Accordingly, a helium plasma of sufficient density may not be formed immediately after the second process starts, and while the second process is performed, density of the helium plasma may gradually increase, such that a helium plasma of sufficient density may be formed only when the second process period ends. For example, it takes longer time to get sufficient density of the helium gas in the comparative example than in the example embodiments. Insufficient density of helium plasma may have a negative effect on an etch rate.

According to an example embodiment, the gas supply device 120 may provide helium gas directly into the chamber by switching a switching valve provided below the flow ratio controller discharging helium gas at a set flow ratio at a time point at which the processing gas is switched to helium gas (e.g., a starting point of switching the gases). Accordingly, a sufficient amount of helium gas may flow into the chamber before the specified stabilization period has elapsed, and a helium plasma of sufficient density may be formed immediately after the second process starts. According to an example embodiment, the etching process may be performed using a helium plasma of sufficient density in the second process period, and a target etch rate may be obtained.

Figures 13A, 13B:
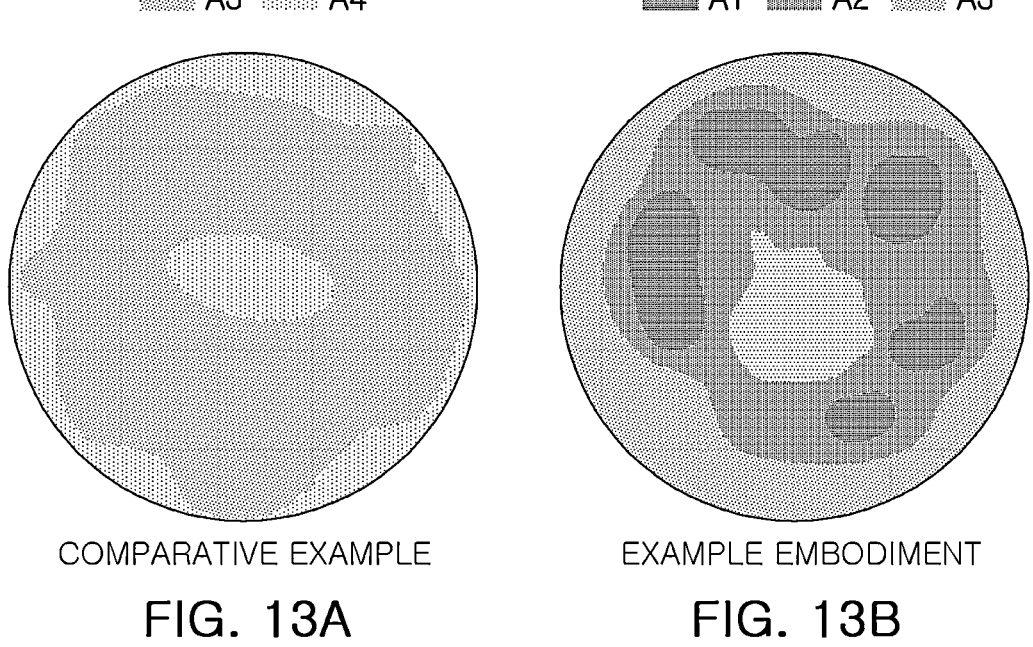
FIGS. 13A and 13B are diagrams illustrating etching performance according to an example embodiment and a comparative example.

FIGS. 13A and 13B are diagrams illustrating etching performance according to an example embodiment and a comparative example.

FIG. 13A is a diagram illustrating an etch rate of a surface of a substrate according to a comparative example. FIG. 13B is a diagram illustrating an etch rate of the surface of the substrate according to an example embodiment. As for regions of the surface of the substrate, a first region A1, a second region A2, a third region A3, and a fourth region A4 are illustrated in descending order of etch rate.

Comparing FIGS. 13A and 13B, an etch rate of the substrate etched according to the comparative example may be lower than an etch rate of the substrate etched according to an example embodiment. As described with reference to FIG. 12, the gas supply device according to the comparative example may have difficulty in providing a sufficient amount of processing gas in the specified stabilization period, and under-etching may occur when the etching process is performed according to the comparative example. The gas supply device 120 according to an example embodiment may provide a sufficient amount of processing gas in a specified stabilization period, such that the plasma processing apparatus 100 may form plasma having sufficient and uniform density during the process period, and the targeted etch rate may be obtained.

Figure 14:
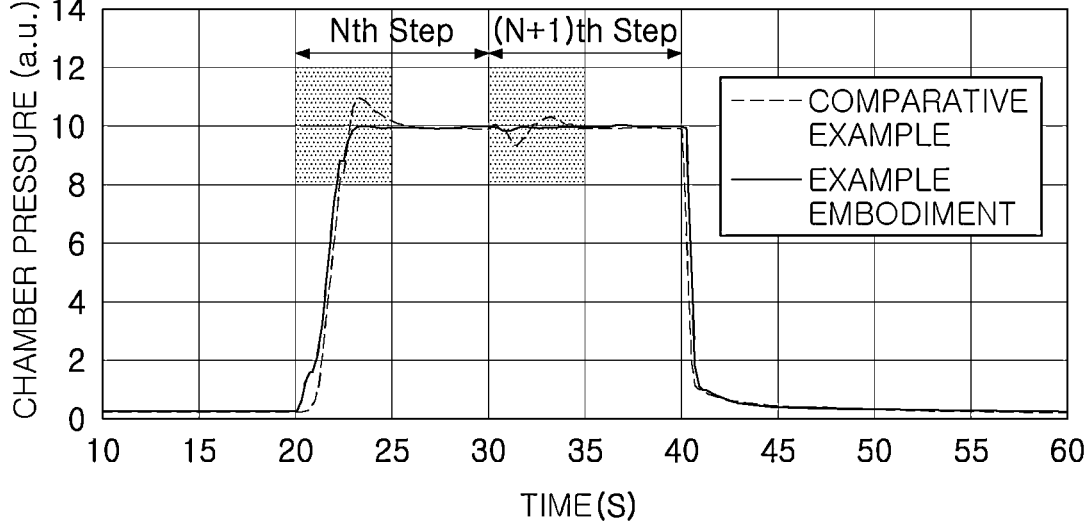
FIG. 14 is a diagram illustrating comparison of chamber pressure according to an example embodiment and a comparative example.

FIG. 14 is a diagram illustrating comparison of chamber pressure according to an example embodiment and a comparative example.

FIG. 14 illustrates internal pressure of the chamber according to a process in an etching process in which a first process using chlorine (Cl2) gas and a second process using nitrogen trifluoride (NF3) gas are alternately performed in each process.

FIG. 14 illustrates an Nth operation in which a first process is performed and a (N+1)th operation in which a second process is performed. When each operation starts, the processing gas provided in the chamber may be switched. For example, to perform the (N+1)th operation, the processing gas may be switched from chlorine gas to nitrogen trifluoride gas.

According to a comparative example, when the processing gas is switched, the type of processing gas flowing into the chamber, a flow rate of the processing gas, a flow ratio of the processing gas, and the like, may change, such that internal pressure of the chamber may change, and it may take time for the pressure to stabilize. In FIG. 14, the time period for which the pressure is stabilized in the comparative example is shaded.

According to an example embodiment, a conductance control valve may be provided in the bypass pipe, and when the processing gas is switched, feedforward control and feedback control may be performed on conductance of the conductance control valve based on the type of processing gas, the flow rate of the processing gas, the flow ratio of the processing gas, and the internal pressure of the chamber, such that changes in internal pressure of the chamber may be suppressed. Since the internal pressure of the chamber may swiftly become uniform after the processing gas is switched, the stabilization period of the plasma processing apparatus 100 may be shortened, and the time required for the entire process may be shortened. Accordingly, productivity of the plasma processing apparatus 100 may be improved.

According to the aforementioned example embodiments, the gas supply device may provide the first processing gas into the chamber of the plasma processing apparatus using the first flow ratio controller, and may discharge the second processing gas output by the second flow ratio controller through a bypass pipe. This may be helpful for fast/swift switch from the second processing gas to the first processing gas in the chamber, and may also be helpful for fast/swift switching back from the first processing gas to the second processing gas in a subsequent process. For example, the gas supply device may swiftly switch the processing gases to form plasma in the chamber by connecting the output pipes from the second flow ratio controller to the internal region of the chamber in a subsequent process.

Also, the gas supply device may control the conductance of the bypass pipe by performing feedforward control and feedback control based on the internal pressure of the chamber, and the like. The gas supply device may suppress changes in internal pressure of the chamber of a plasma processing apparatus without limiting the conductance of the supply pipes.

The plasma processing apparatus may, by swiftly switching the processing gases to form plasma and suppressing changes in internal pressure of the chamber, shorten the stabilization period for starting the process in each process and the time required for the entire process. Accordingly, productivity of the plasma processing apparatus may be improved.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context clearly indicates otherwise, and the present disclosure includes the additional embodiments.

While the example embodiments have been illustrated and described above, it will be configured as apparent to those skilled in the art that modifications and variations may be made without departing from the scope in the example embodiment as defined by the appended claims.

What is claimed is:

1. A gas supply device, comprising:
   a first flow ratio controller configured to output a first processing gas supplied from a gas box to a plurality of first output pipes according to a first flow ratio;
   a second flow ratio controller configured to output a second processing gas supplied from the gas box to a plurality of second output pipes according to a second flow ratio;
   a plurality of first supply valves connecting the plurality of first output pipes to a plurality of supply pipes connected to a plurality of regions in a chamber;
   a plurality of second supply valves connecting the plurality of second output pipes to the plurality of supply pipes;
   a plurality of first bypass valves connecting the plurality of first output pipes to a bypass pipe;
   a plurality of second bypass valves connecting the plurality of second output pipes to the bypass pipe;
   a conductance control valve configured to control conductance of the bypass pipe; and
   a controller configured to supply the first processing gas into the chamber at a first time point at which a processing gas supplied into the chamber is switched from the second processing gas to the first processing gas, by opening the plurality of first supply valves and the plurality of second bypass valves and to close the plurality of second supply valves and the plurality of first bypass valves, configured to supply the second processing gas into the chamber at a second time point at which a gas supplied into the chamber is switched from the first processing gas to the second processing gas, by opening the plurality of second supply valves and the plurality of first bypass valves and to close the plurality of first supply valves and the plurality of second bypass valves, and configured to control the conductance control valve to suppress changes in internal pressure of the chamber at the first time point and the second time point.

2. The gas supply device of claim 1, wherein the controller is configured to determine an initial value of conductance of the conductance control valve by performing feedforward control based on at least a portion of factors including a type of processing gas to be switched at the first time point or the second time point, a flow rate of the processing gas to be switched, a flow ratio applied to the processing gas to be switched, a difference in flow rates between the processing gas before switching and the processing gas to be switched, internal pressure of the chamber and an opening/closing rate of a VAT valve provided in an exhaust device of the chamber.

3. The gas supply device of claim 2, wherein the controller is configured to experimentally determine the initial value of conductance of the conductance control valve according to a combination of the factors.

4. The gas supply device of claim 2, wherein the controller is configured to determine a function to determine an optimal adjustment value by performing machine learning using the initial value of conductance determined experimentally according to a combination of the factors.

5. The gas supply device of claim 2, wherein the controller is configured to monitor the internal pressure of the chamber in real time according to the initial value of the conductance, and to adjust the conductance control valve to suppress changes in the internal pressure of the chamber by performing feedback control based on the internal pressure of the chamber.

6. The gas supply device of claim 2, wherein the controller is configured to obtain the type of processing gas to be switched, the flow rate of the processing gas to be switched, and the flow ratio applied to the processing gas to be switched by referring to a process recipe.

7. The gas supply device of claim 2, wherein the controller is configured to obtain the internal pressure of the chamber from a chamber pressure sensor of the chamber.

8. The gas supply device of claim 7, wherein an adjustment value of conductance of the conductance control valve is determined based on an initial value of conductance determined experimentally according to a combination of the factors.

9. The gas supply device of claim 1, wherein the controller is configured to control the conductance control valve such that conductance of the plurality of supply pipes is the same as conductance of the bypass pipe at the first time point and the second time point.

10. The gas supply device of claim 1, wherein the plurality of regions in the chamber includes a central region vertically overlapping a central portion of a substrate disposed in the chamber, a peripheral region vertically overlapping a peripheral portion of the central region, and an outer region vertically not overlapping the substrate.

11. The gas supply device of claim 1, wherein the gas box includes:

a plurality of gas sources configured to store a plurality of processing gases including the first processing gas and the second processing gas;

a plurality of flow rate controllers configured to control flow rates of the plurality of processing gases output by the plurality of gas sources; and a plurality of source valves configured to output the first processing gas output by the plurality of flow rate controllers to the first flow ratio controller and output the second processing gas output by the plurality of flow rate controllers to the second flow ratio controller.

12. The gas supply device of claim 11, wherein the plurality of flow rate controllers are configured as mass flow controllers.

13. A gas supply device, comprising:

a first flow ratio controller configured to output a first processing gas supplied from a gas box to a plurality of first output pipes according to a first flow ratio;

a second flow ratio controller configured to output a second processing gas supplied from the gas box to a plurality of second output pipes according to a second flow ratio;

a first switching valve set connecting the plurality of first output pipes to a plurality of supply pipes connected to a plurality of regions in a chamber or to a bypass pipe;

a second switching valve set connecting the plurality of second output pipes to the plurality of supply pipes or the bypass pipe;

a conductance control valve configured to control conductance of the bypass pipe; and a controller configured to control the conductance control valve such that conductance of the bypass pipe is the same as conductance of the plurality of supply pipes at a first time point at which a processing gas provided by the plurality of supply pipes is switched from the first processing gas to the second processing gas, or a second time point at which the processing gas provided by the plurality of supply pipes is switched from the second processing gas to the first processing gas.

14. The gas supply device of claim 13, wherein the controller is configured to control the conductance control valve by performing feedforward control based on a process recipe and internal pressure of the chamber.

15. The gas supply device of claim 14, wherein the controller is configured to control the conductance control valve by further performing feedback control based on the internal pressure of the chamber.

16. The gas supply device of claim 13, wherein the first switching valve set includes a plurality of 3-way valves provided between the plurality of first output pipes and the plurality of supply pipes, and between the plurality of first output pipes and the bypass pipe, and wherein the second switching valve set includes a plurality of 3-way valves provided between the plurality of second output pipes and the plurality of supply pipes, and between the plurality of second output pipes and the bypass pipe.

17. The gas supply device of claim 13, wherein the first switching valve set includes a plurality of first supply valves connecting the plurality of first output pipes to the plurality of supply pipes, and a plurality of first bypass valves provided between the plurality of first output pipes and the bypass pipe and configured to operate complementarily with the plurality of first supply valves, and wherein the second switching valve set includes a plurality of second supply valves connecting the plurality of second output pipes to the plurality of supply pipes, and a plurality of second bypass valves provided between the plurality of second output pipes and the bypass pipe and configured to operate complementarily with the plurality of second supply valves.

18. A gas supply device, comprising:

a plurality of flow ratio controllers configured to output a plurality of processing gases supplied from a gas box according to a predetermined flow ratio, respectively;

a plurality of switching valve sets connecting the plurality of flow ratio controllers to a plurality of supply pipes connected to a plurality of regions in a chamber or to a bypass pipe;

a conductance control valve configured to control conductance of the bypass pipe; and a controller configured to control a processing gas output by one of the plurality of flow ratio controllers to be discharged through the bypass pipe, while a processing gas output by another of the plurality of flow ratio controllers is supplied to the plurality of regions in the chamber, wherein the controller is configured to perform feedforward control and feedback control over the conductance control valve based on a process recipe and pressure of the chamber at a time point at which a processing gas supplied to the plurality of regions is switched.

19. The gas supply device of claim 18, wherein the controller is configured to control the conductance control valve such that conductance of the bypass pipe is the same as conductance of the plurality of supply pipes connected to the plurality of regions in the chamber.

20. The gas supply device of claim 18, wherein the plurality of supply pipes are connected to a gas distribution device of a plasma processing apparatus.

* * * * *